United States Patent
Fabian et al.

(10) Patent No.: US 6,548,131 B1
(45) Date of Patent: Apr. 15, 2003

(54) QUARTZ GLASS CRUCIBLE AND PROCESS FOR THE MANUFACTURE OF THE CRUCIBLE

(75) Inventors: Heinz Fabian, Grossostheim (DE); Martin Arndt, Bitterfeld (DE); Johann Leist, Altenstadt (DE); Udo Gertig, Johannesberg (DE); Wolfgang Englisch, Kelkheim (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 0 days.

(21) Appl. No.: 09/547,845

(22) Filed: Apr. 12, 2000

(30) Foreign Application Priority Data

Apr. 16, 1999 (DE) .......................... 199 17 288

(51) Int. Cl.[7] .......................... B32B 1/08; C03C 17/02; C03B 19/08; C03B 35/00
(52) U.S. Cl. .............. 428/34.4; 428/34.1; 428/694 SG; 428/167; 428/213; 428/312.6; 428/318.6; 428/319.1; 428/428; 118/726
(58) Field of Search ................ 428/141, 34.1; 118/726; 427/34.4, 156, 161, 163, 167, 169, 213, 212, 312.6, 318.6, 319.1, 426, 428

(56) References Cited

U.S. PATENT DOCUMENTS 4,528,163 A  7/1985  Albrecht 6,150,006 A  * 11/2000  Hellman et al. ............ 428/141
6,306,489 B1  10/2001  Hellmann et al. ........ 428/312.6

FOREIGN PATENT DOCUMENTS

| DE | 197 13 014 A1 | 10/1998 | |
| DE | 19713014 | 10/1998 | |
| DE | 19719133 A | * 12/1998 | ........... C03B/20/00 |
| EP | 0 338 914 A1 | 10/1998 | |

OTHER PUBLICATIONS

Derwent Abstract for DE 19719133.
Derwent Abstract for DE 19713014.
Patent Abstracts of Japan, Publication No. 07196397, published Aug. 1, 1995.
Patent Abstracts of Japan, Publication No. 02188489, published Jul. 24, 1990.

* cited by examiner

Primary Examiner—Harold Pyon
Assistant Examiner—Michael C. Miggins
(74) Attorney, Agent, or Firm—Andrew L. Tiajoloff (57) ABSTRACT

To facilitate the start of a process using a quartz glass crucible with a crucible body and an inner layer of quartz glass a quartz glass crucible is provided with an inner surface roughened at least in the starting zone region by multiple depressions disposed at a maximum distance of 5 mm from one another. Furthermore, a simple and inexpensive process for the manufacture of such a quartz glass crucible is described, by providing a crucible body with a smooth inner surface of quartz glass and subsequently roughening the inner layer in the starting zone region by multiple depressions disposed at a maximum of 5 mm from one another.

20 Claims, 5 Drawing Sheets

QUARTZ GLASS CRUCIBLE AND PROCESS FOR THE MANUFACTURE OF THE CRUCIBLE

FIELD OF THE INVENTION

The present invention relates to a quartz glass crucible having a crucible body with an inner surface of quartz glass. Furthermore, the invention relates to a process for manufacturing a quartz glass crucible by providing a crucible body with an inner surface of quartz glass.

BACKGROUND OF THE INVENTION

Quartz glass crucibles are employed for example for the pulling of monocrystals from a melt according to the Czochralski method. A crucible of this kind and a manufacturing process therefor are described in U.S. Pat. No. 4,528,163. The known crucible comprises a crucible base body of natural quartz glass with a floor joined to an essentially cylindrical side wall. The crucible has an inner layer of transparent synthetically manufactured quartz glass formed by vitrification of a granulate layer of synthetically manufactured $SiO_2$ granulate.

To produce the known quartz glass crucible, natural quartz crystalline granulate is added, in a first process step, into a metallic mold rotating about its central axis, to form an evenly thick outer layer in the shape of a crucible. With continued rotation of the mold, synthetically produced $SiO_2$ powder is then added and it deposits on the inner wall of the outer layer as a granulate layer, and is subsequently melted to form a resistant inner layer firmly joined to the outer layer. In order to avoid formation of crystal seedlings and bubbles in the inner layer, the melting temperature is set high enough so that the added granulate melts completely. The inner surface of the known quartz glass crucible is therefore formed by a smooth amorphous inner layer. A similar process is also known where a crucible-shaped outer layer of crystalline quartz granulate and a granulate of synthetically produced $SiO_2$ powder are fixed on the inner wall of the mold by vacuum action. The outer layer and the granulate layer are then vitrified together.

When a monocrystal is pulled according to the Czochralski method, for example when a silicon monocrystal is pulled from a silicon melt, a seed crystal of predetermined orientation is dipped into the melt and then pulled slowly upward. The seed crystal and the melt rotate in opposite directions. Surface tension between the seed crystal and the melt causes a small amount of the melt to be pulled along with the seed crystal and as the melt slowly cools it forms a continuously growing monocrystal. However, it may happen in the process that the seed crystal breaks off so that the so-called "starting process" needs to be initiated anew. The period before the actual pulling of the monocrystal can last several hours so that the process becomes correspondingly longer. A long starting process is a considerable expense factor. In addition, as the process time increases so does the thermal and chemical stressing of the quartz glass crucible.

SUMMARY OF THE INVENTION

The object of the invention is to provide a quartz glass crucible which simplifies the starting process, and an inexpensive process for the manufacture of such a crucible.

As regards the quartz glass crucible, the object is achieved according to the invention on the basis of the crucible described above in that the inner surface is roughened at least in the starting zone area by multiple depressions disposed at a distance of no more than 5 mm from one another.

During the pulling of a crystal the inner surface is in contact with the melt. The starting zone comprises that area of the inner surface of the quartz glass crucible where the surface of the melt is located during the starting process. It is an area extending around the inner wall of the crucible. It has been shown that a melt surface free of vibrations and oscillations is decisive for a successful starting process. Oscillations of the melt surface, as caused by for example the rotation of the melt and of the seed crystal, or by the dipping of the seed crystal, are dampened by the crucible according to the invention. This is so because the roughening of the inner surface in the starting zone causes a stabilization and a calming of the melt surface. Roughening the starting zone provides depressions in the surface which prevent in-phase wetting and non-wetting of the surface. This measure prevents oscillations from developing or increasing or at least reduces their intensity, so that fluctuations of the melt surface are reduced or dampened. In order for the depressions to develop a corresponding effect, a roughness profile in at least the starting zone is selected such that it comprises multiple depressions disposed no more that 5 mm from one another. The depressions may overlap. What is of substance is that the inner surface is roughened in the starting zone. The relative geometric position of the depressions in relation to the height of the remainder of the inner surface is not relevant therefor. The depression may be below the remaining inner surface but also on it or above it, if additional quartz glass layers are deposited on the inner surface. The roughened area need not be limited to the starting zone. It is also not required for the success of the inventions' teaching that the surface is roughened without gaps in the circumferential starting zone. It is merely of substance that there is in the region of the melt surface a roughened surface with multiple depressions.

The more pronounced the roughness profile in the starting zone the greater the oscillation dampening effect of the roughness. A particularly well tried roughness has depressions disposed at max. 1 mm from one another, preferably at max. 100 μm.

An inner surface of synthetic quartz glass is distinguished by its purity so that little contamination passes into the melt when the quartz glass crucible is used in applications as intended. The inner surface of synthetic quartz glass is usually formed by depositing on a crucible base body an inner layer a few millimeters thick.

Different variants of the structural design of the surface roughness in the starting zone region have been shown to be advantageous and they may be present alternatively or cumulatively, as described below in more detail.

In a first variant of the embodiment the surface of the inner surface has an etched structure. A suitable etched structure is described for example in DE A 197 13 014. Such etched surface has irregular raised structural elements extending between a first higher plane and a second lower plane, where a plurality of structural elements has a substantially flat top surface extending to all sides and is delimited on all sides in facet like manner by substantially flat side surfaces which extend between the first and the second plane and where the average depth of roughness $R_a$ is between 0.1 μm and 10 μm and the size of the projections of the structural elements to the first plane on average ranges between 30 μm and 180 μm. An etching process and an etching solution suitable for producing such etched structure is also known from DE A 197 13 014. This embodiment is distinguished by a particularly durable surface which in addition substantially reduces the above-described oscillation phenomenon in the melt.

In a further variant of the embodiment the inner surface has a repeating surface impression pattern which is characterized by depressed or raised regularly repeating structures. Due to the regularity of the impression pattern this variant of the embodiment is distinguished by a particularly reproducible effect as regards the stabilization of the starting process.

Another preferred variant of the embodiment of the quartz glass crucible is characterized by an inner surface provided with scores. The scores may be made by for example tools, grinding means, the effect of a particle stream or by laser treatment. In this embodiment the inner surface may be particularly finely structured which can facilitate wetting by the melt and can reduce distortions of the melt surface.

In a further variant of the embodiment the inner surface has a bubble layer with open pores. The open pores provide an additional free volume reservoir for the melt so that a movement of the melt surface can be intercepted effectively.

It has been shown to be particularly advantageous if the inner surface outside of the starting zone region has been fire polished. A fire polished, smooth surface is more easily cleaned than a rough surface and is less readily attacked by the melt. In this embodiment the rough surface is limited to what is necessary for an improvement of the starting process.

As regards the process for manufacturing a quartz glass crucible of this kind, the above-described objective is achieved according to the invention on the basis of the process described initially in that the inner surface is roughened in the starting zone region by multiple depressions which are disposed at a distance of no more than 5 mm from one another.

Roughening of the starting zone provides causes stabilization and calming of the melt surface. Depressions are created in the starting zone which prevent in phase wetting and non-wetting of the surface by the melt. This measure prevents oscillations from developing or increasing or at least reduces their intensity so that fluctuations of the melt surface are reduced or dampened. In order for the roughening to develop a corresponding effect, a roughness profile in at least the starting zone is selected such that it comprises multiple depressions disposed no more that 5 mm from one another. A discussion of the position of the starting zone and the effect and design of the roughening may be found in the above explanation of the quartz glass crucible according to the invention.

The more pronounced the roughness profile in the starting zone the greater the oscillation dampening effect of the roughness. Advantageously, a dense roughness profile is selected, with depressions disposed at max. 1 mm from one another, preferably at max. 100 $\mu$m.

Several process variants for producing the surface roughness in the starting zone region have been shown to be advantageous and they may be applied alternatively or cumulatively as described below in more detail.

In a first process variant the surface of the inner surface is roughened by etching with an etching solution. A suitable etching process and a suitable etching solution are described for example in DE A 197 13 014. The etching process is simple to implement and it can simultaneously serve to clean the inner surface of the crucible. The etching may also be limited to an area around the starting zone. Etching results in clean inner surfaces having a 'hilly' structure.

In a further process variant the inner surface is softened and a repeating pattern is impressed into the softened surface. The pattern of impressions is characterized by depressed or raised structures which repeat themselves regularly. It may be produced by for example a pattern die or roller. The impression of a pattern is particularly simple during a process stage when the inner surface of is still soft due to heat residue from the heating of the granulate layer. This eliminates the high temperature step that would have been otherwise necessary in order to soften the inner surface.

In another preferred variant of the process scores are made in the inner surface. Such scores are easily produced by for example diamond tools or by loose abrasive means. The inner surface can also be structured by laser treatment and score structures having defined patterns can also be produced. With a view to a simple production of the quartz glass crucible it has been shown to be advantageous to produce the scores by a particle stream. The particle stream may also be a gas or liquid stream charged with abrasives. In this respect a particularly preferred particle stream is one containing frozen $CO_2$ pellets. The $CO_2$ pellets evaporate without any residue so that contamination by for example remnants of abrasives are avoided.

A variant of the process has been shown to be particularly advantageous wherein production of the crucible body comprises pouring $SiO_2$ granulate into a mold with an additive being added to the $SiO_2$ granulate. The said additive reacts when heated and releases a gas thereby producing a pore containing bubble layer in the region of the starting zone. The pore containing bubble layer can be easily limited to the starting zone region by adding the additive component only during the production of the inner surface in that region. The additive component may be for example $Si_3N_4$ or AlN which react during heating and release nitrogen containing gases.

In a further variant of the process a rough surface layer is deposited at least in the region of the starting zone. The surface layer may be produced by pouring in $SiO_2$ granulate according to for example the pouring process described above in more detail, and the roughness is created by for example a low vitrification temperature or by additives with a high melting temperature, such as SiC, added to the $SiO_2$ granulate. This variant of the embodiment is particularly inexpensive since the production of a roughened surface layer is easily incorporated into the manufacture of the crucible by the pouring in method.

BRIEF DESCRIPTION OF THE DRAWINGS

The invention will be explained below in more detail by means of examples and the drawing. The drawing shows in particular in FIG. 1, a schematic representation of a process for the manufacture of a quartz glass crucible according to the so called pouring in technique and a device suitable therefor, in FIG. 2, a electron microscope image of a typical etched structure of the quartz glass component surface, in FIG. 3a, a schematic representation of a device for applying an imprint pattern on the inner wall of a quartz glass crucible, in FIG. 3b, an enlargement of detail A in FIG. 3a, in FIG. 4, a process and a device suitable for practicing the process, of roughening the crucible inner surface in the starting zone region by means of a particle stream, in schematic representation, and in FIG. 5, a schematic representation of a process, and a device suitable therefor, for the coating of the crucible inner surface in the starting zone region.

DETAILED DESCRIPTION

The production of a quartz glass crucible by the so-called pouring in technique will be explained below in more detail by way of the device schematically shown in FIG. 1.

The device comprises a metallic mold 1 with an outer flange 2 resting on a support 3. The support 3 is rotatable about its central axis 4 (direction of the rotation is indicated by the arrow 5 in FIG. 1). A feed tube 7, connected to a $SiO_2$ granulate supply container 6 protrudes into the mold 1, said feed tube being displaceable in directions x and y as indicated by the arrows 8. The device also comprises an electrode pair with an anode 9 and a cathode 10, likewise displaceable in the directions x and y and used to ignite a plasma 12 when in operation.

In a first process step the natural quartz granulate is poured into a mold 1 rotating about its central axis 4. A quartz granulate layer 13 of an even thickness is formed thereby and is held on the inner wall of the mold 1 by centrifugal forces.

In a second process step, granulate 14 of synthetically manufactured $SiO_2$ is poured into the rotating mold 1 while the feed tube 7 is continuously moved from bottom to top or from left to right. A quartz granulate layer 13 of $SiO_2$ forms on the inner wall and is melted by the plasma heat to form a transparent inner layer 15 of high-purity $SiO_2$ and is at the same time fire polished. The quartz granulate layer 13 solidifies to form an opaque outer layer. The crucible produced in this manner is then allowed to cool.

The thickness of the opaque outer layer in the finished quartz glass crucible is about 5 to 20 mm and the thickness of the inner layer of synthetically produced $SiO_2$ is about 2.5 mm. The smooth and transparent inner layer 15 is distinguished by high mechanical, thermal and chemical resistance.

In a third process step the surface of the inner layer 15 is roughened in the region of a circumferential starting zone 16. The starting zone encompasses that region of the crucible's inner surface where the surface of the melt attacks when the quartz glass crucible is used according to its purpose for the pulling of monocrystals. Commonly the starting zone 16 is in the upper third of the quartz glass crucible as indicated by the cross-hatched area in FIG. 1. The height of the starting zone 16 is at least a few millimeters in order to accommodate changes of the melt surface.

The various methods of roughening the surface of the inner layer 15—at least in the region of the starting zone 16—will be explained in more detail below.

In a first method the surface of the inner layer 16 is roughened by chemical etching. This creates an etched structure extending over the entire inner surface region of the quartz glass crucible as shown in the electron microscope image in FIG. 2.

An inner surface having an average roughness $R_a$ of at least 2 μm in the region of the starting zone has been shown to be useful. The average $R_a$ value is determined according to DIN 4768. It can be seen in the electron microscope image shown in FIG. 2 that the surface is characterized by multiple raised elements 21 with irregular delimiting lines. The raised elements have sharp corners and edges which are separated by trenches 22. The raised elements 21 appear as dark spots in the image, the trenches 22 as lighter delimiting lines. In the actual embodiment the average size of the raised elements 21 is approximately 100 μm. The $R_a$ value of the surface shown in FIG. 2 is approximately 2 μm.

The image shows substantially five irregular raised truncated pyramids 21. The raised elements 21 are partially shaped as polygons with a distinct top surface. The polygon is delimited by side walls 23 extending downward at an angle. The walls are in part clearly of step-wise formation. The depths of the individual steps are not uniform; on average the depth is about 1 μm. The height of the individual steps also varies. The individual raised elements 21 are separated from one another by trenches 22 with an average width D of about 2 μm. Their base is not flat in the embodiment but is irregular due to multiple small adjoining trenches of less than 1 μm in diameter.

Figure 2:
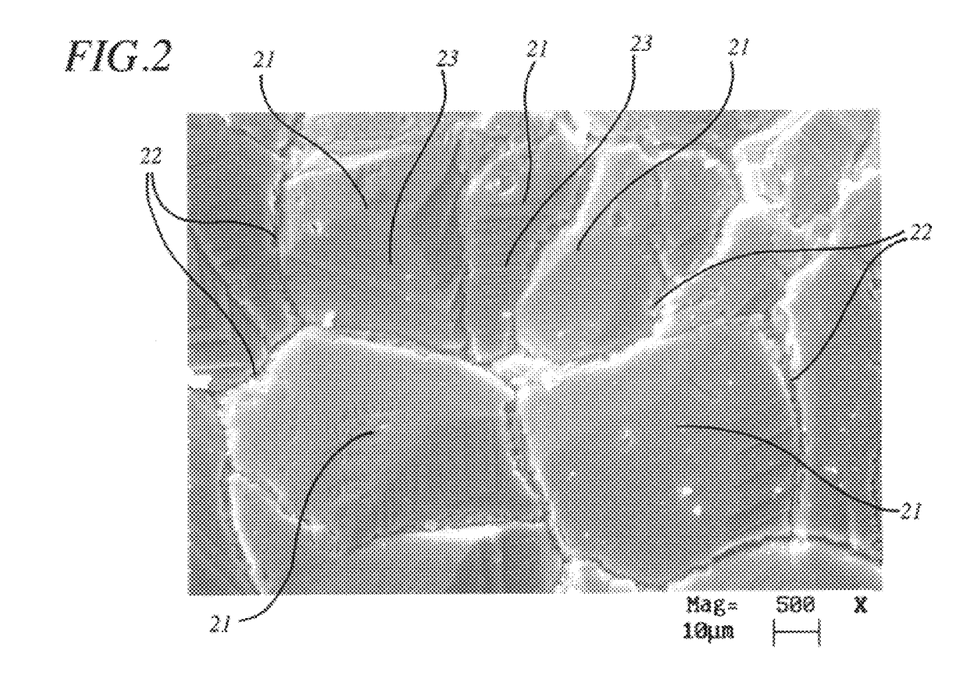

In order to produce the surface shown in FIG. 2, the surface of the inner layer 15 is first fire polished and then cleaned in an alcohol solution and an etching solution containing hydrofluoric acid. A clean and homogeneous surface contributes to the creation of an even roughness and the above-described microstructure over the entire inner surface of the crucible.

An etching solution of the following composition is prepared:

23.6 percent by weight HF (added as a 50% HF solution)

17.4 percent by weight of ammonium fluoride (added as a solid)

35.4 percent by weight acetic acid (added as 100% acetic acid, pure acetic acid) and 23.6 percent by weight water.

The etching solution is stabilized by resting for one hour. The stabilization of the etching solution also contributes to a uniform roughness and the above described fine-grain microstructure extending over the entire inner surface of the crucible. After the crucible is brought to a temperature of about 15° C. it is dipped into the etching solution. The treatment lasts 60 min. at an etching solution temperature of about 15° C. Thereafter the inner layer 15 is again cleaned in a 5% hydrofluoric acid solution for ten minutes. After this etching and cleaning treatment the entire inner surface exhibits the microstructure shown in FIG. 2.

Figure 1:
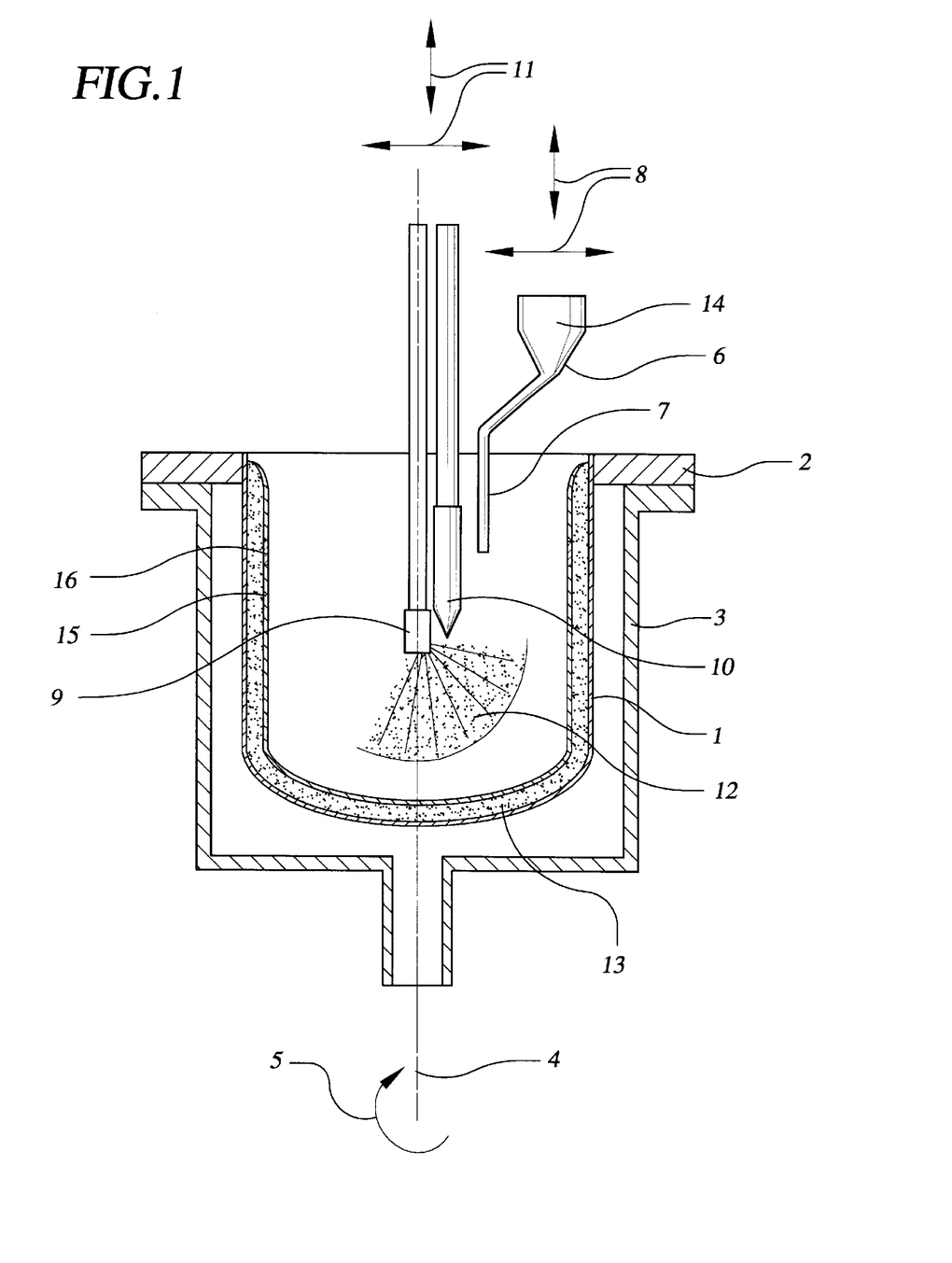

Insofar as the following descriptions to the figures have identical reference numerals as in the description of the device according to FIG. 1 these numerals will be referring to the same or equivalent components of the device as described in more detail in the above discussion of FIG. 1.

Figure 3A:
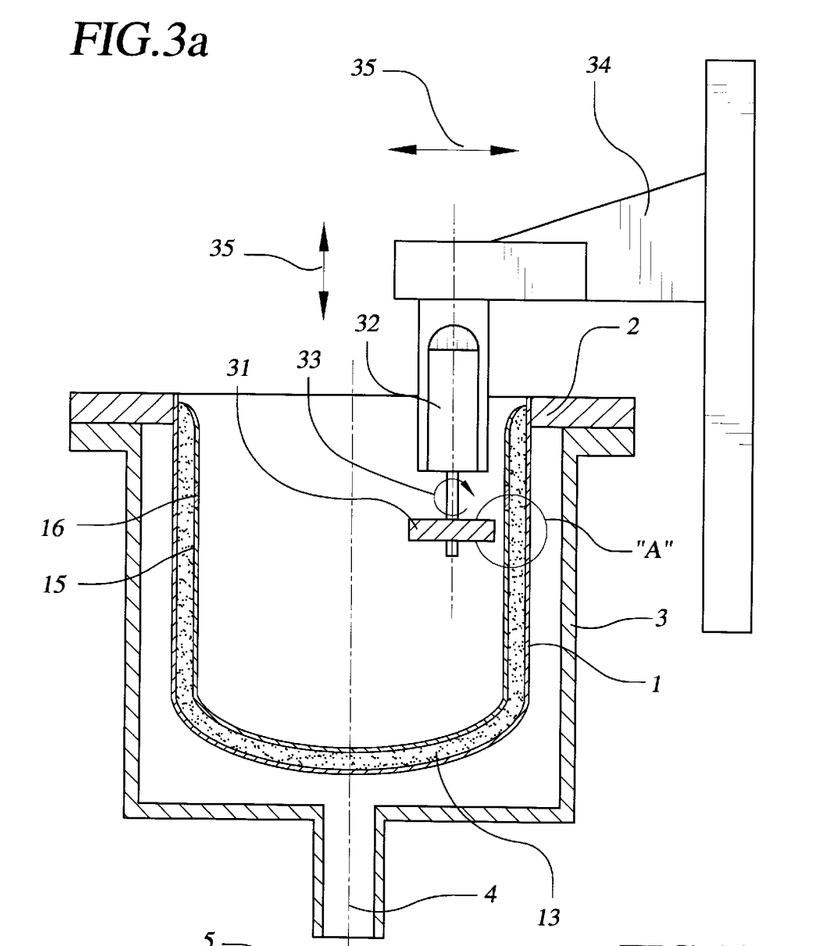

FIG. 3a schematically shows a device for the application of a pattern in the starting zone region 16 of a quartz glass crucible by means of a pattern roller 31. The pattern roller 31 comprises a graphite disc rotatable about its central axis by a drive unit 32 as indicated by directional arrow 33. In order to allow movement of the pattern roller 31 in the starting zone region 16 it is displaceable by means of a support structure 34 upward and downward as well as vertically in relation to a rotational axis 5 (directional arrows 35). The outer surface layer of the pattern roller 31 is provided with a pattern. During the cooling phase of the pouring in process described by way of FIG. 1, the pattern of the outer layer of the pattern roller 31 is impressed into the still-soft inner surface 15 of the quartz glass crucible. In this way a repeating pattern is made in the region of the circumferential starting zone 16. In the simplest manner this is achieved in that the quartz glass crucible rotates about the rotational axis 4 and the pattern roller 32 rotates at the same time about its rotational axis 4 in the same direction (directional arrow 33) while in contact with the inner surface 15.

Figure 3B:
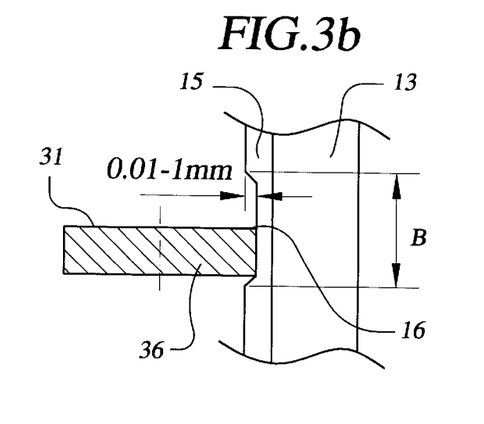

FIG. 3b shows an enlarged detail A of FIG. 3a. The pattern structure of the roller 31 is in this case a striped pattern. The individual stripes are designed as steps 36 extending parallel to one another and at a 45° angle relative to the rotational axis 4 and at a distance of 0.5 mm from one another. The height of the steps is 10 $\mu$m. In order to produce the impression pattern in the region of the starting zone 16 the pattern roller 31 is pressed into the still-soft inner layer 15 as described above. A depression is created extending along the circumference in the starting zone region 16. The width B of the said depression is determined by the up and down motion of the roller 31 in direction 35 while the depth of the depression is substantially determined by the pressure applied. In this embodiment the width of the depression (i.e., the width B of the starting zone 16) is about 5 mm. The depth of the impression ranges from 10 $\mu$m in the regions where only the steps 36 are impressed into the starting zone 16, to about 1 mm in the regions where the roller 31 is altogether pressed somewhat more strongly into the inner layer 15.

Multiple alternatives exist besides the stripe pattern shown in FIG. 3b. They are for example diamond shape patterns resulting from a roller pattern on which raised diamond shaped regions are alternating with diamond shaped depressions. The height differential between raised and depressed regions is 20 $\mu$m and the sides of the diamonds measure 1 mm.

Figure 4:
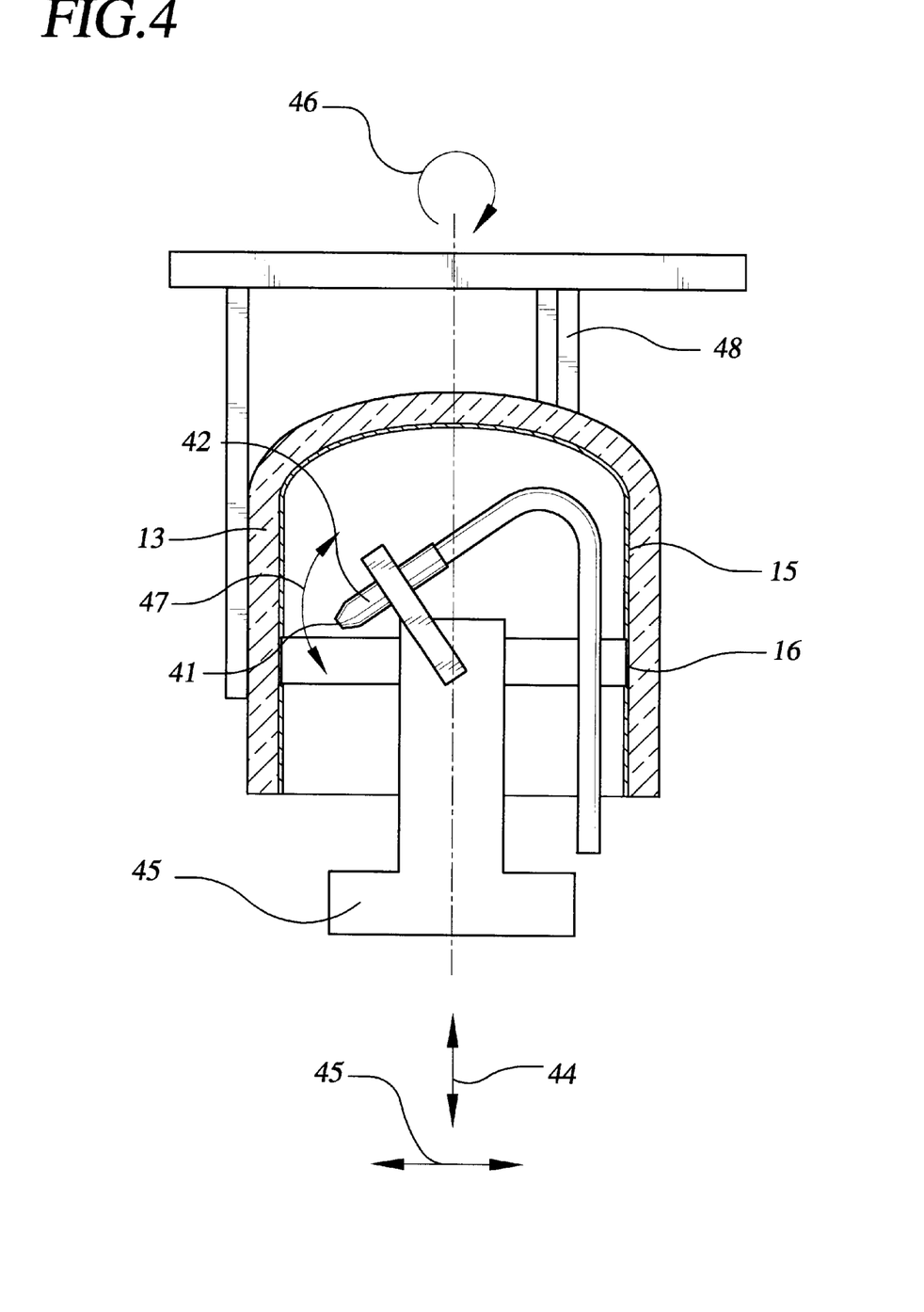

FIG. 4 schematically shows an alternative process for the roughening of the crucible inner surface in the starting zone 16 and a device suitable therefor. In this case the roughening takes place by means of a stream of frozen $CO_2$ pellets, similar to sandblasting. The stream of frozen $CO_2$ pellets 41 is directed at the inner wall 15 in the region of the starting zone 16 by means of nozzle 42 guided by suspension 43. The crucible is held in a three jaw chuck 48 and rotated about its central axis (directional arrow 46). The nozzle 42 is movable up and down (directional arrow 44) and sideways (directional arrow 45) and is additionally tiltable relative to the crucible central axis as shown by arrow 47. Thus the nozzle can be directed at any point of the side wall of the crucible. The average depth of roughness in the region of the starting zone 16 produced in this process substantially depends on the kinetic energy of the $CO_2$ pellets 41 and the length of treatment. In the exemplary embodiment an average depth of roughness $R_a$ of 20 $\mu$m in the starting zone region 16 was achieved using $CO_2$ pellets 41 with an average size of about 100 $\mu$m, a pressure of 3 bar, a distance between nozzle 42 and wall of crucible of about 5 cm, and a treatment duration of 10 minutes. The depressions thus produced are distributed statistically and overlap in part. The distance between adjoining depressions is in every case less than 100 $\mu$m. Alternatively hereto, an average depth of roughness $R_a$ of 15 $\mu$m is achieved by irradiation with a commercially available $CO_2$ laser held movably in support device 43 instead of nozzle 42.

Figure 5:
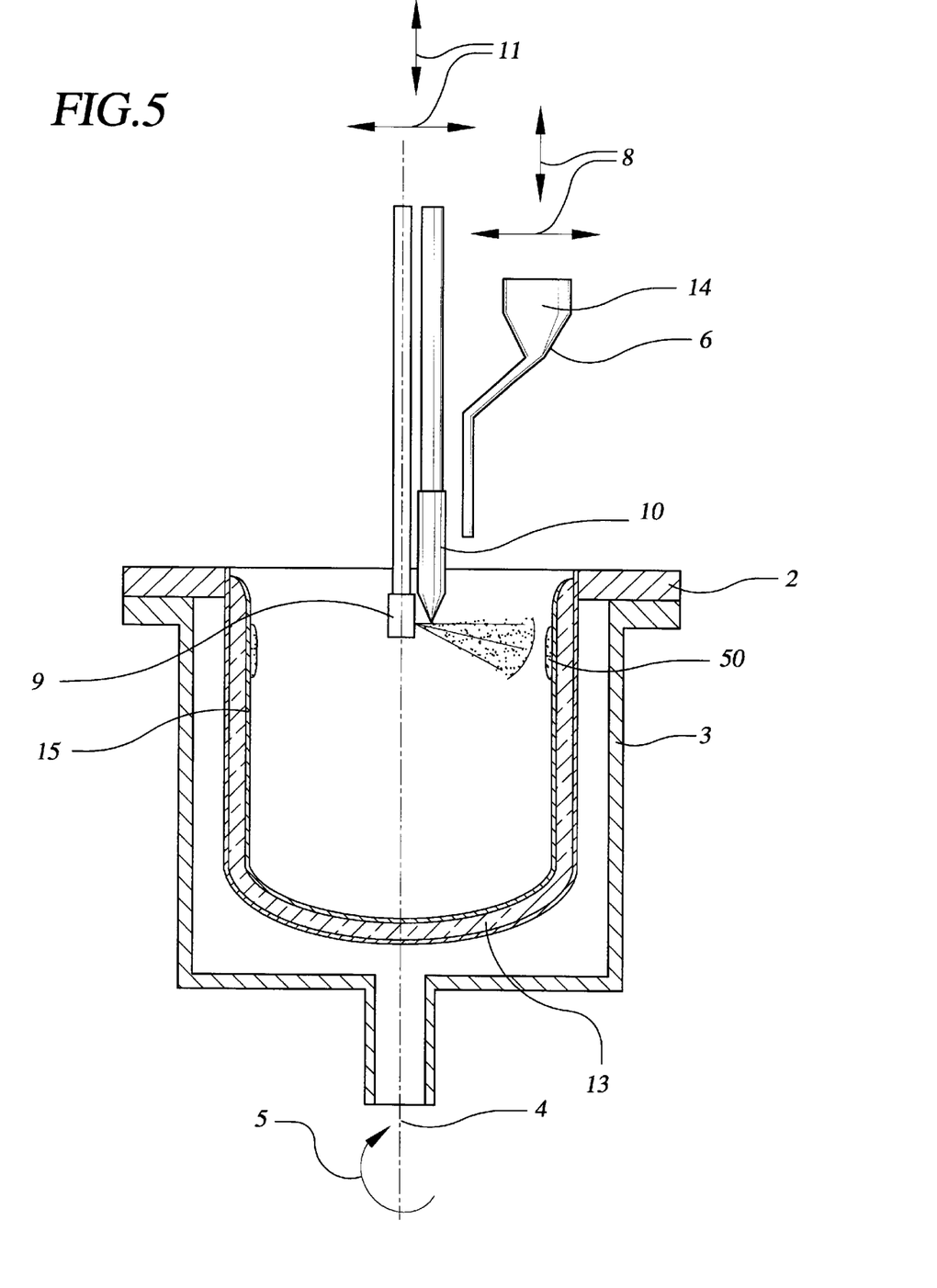

Shown schematically in FIG. 5 is a further process for the roughening of the crucible inner surface, and a device suitable therefor. The roughening is accomplished by forming a rough surface layer 50 in the starting zone region. The surface layer 50 is formed, analogously to the pouring in process described in more detail above, either on the inner layer 15 (as shown in the embodiment illustrated in FIG. 6) or instead of the inner layer 15. In both variants an additional component is added to the synthetic $SiO_2$ granulate, namely 0.1–2% by weight of $Si_3N_4$. This additional component decomposes during heating, releasing nitrogen containing gases so that after the vitrification a bubble containing surface layer 50 is obtained. After opening of the bubbles, by for example superficial etching, the average depth of roughness $R_a$ of the surface layer 50 is about 100 $\mu$m. The density of bubble distribution in the surface depends on the quantity of the added component. The distance between adjoining bubbles is less than 5 mm.

In the quartz glass crucibles according to the invention the starting of the seed crystal for the subsequent pulling of the monocrystal almost always succeeds on the first try while in other crucibles several attempts are frequently required. Presumably this effect is based on the suppression of melt surface vibrations which can develop due to the interaction between melt, crucible walls and gas phase.

What is claimed is:

1. A quartz glass crucible comprising:
   a crucible body with an inner surface of quartz glass;
   the inner surface comprising a roughened portion in a starting zone in said crucible, said roughened portion being roughened by multiple depressions therein; the multiple depressions being spaced from one another at a maximum distance of 5 mm; and
   the inner surface outside of the starting zone being smoother than in said roughened portion, wherein said roughened portion in the starting zone is located in an upper third of the crucible.

2. The quartz glass crucible according to claim 1, wherein the depressions are separated by a maximum distance of 1 mm.

3. The quartz glass crucible according to claim 1, wherein the depressions are separated by a maximum distance of 100 $\mu$m.

4. The quartz glass crucible according to claim 1, wherein the inner surface is formed of synthetic quartz glass.

5. The quartz glass crucible according to claim 1, wherein said roughened portion of the inner surface has an etched structure.

6. The quartz glass crucible according to claim 1, wherein said roughened portion of the inner surface has a repeating impression pattern.

7. The quart glass crucible according to claim 1, wherein said roughened portion of the inner surface is scored so as to have scores therein.

8. The quartz glass crucible according to claim 1, wherein said roughened portion in the starting zone of the inner surface has a bubble zone in which the inner surface has open pores therein.

9. The quartz glass crucible according to claim 1, wherein, outside of the starting zone, the inner surface is fire polished.

10. A quartz glass crucible comprising:
    a crucible body of quartz glass, said crucible body comprising an inner wall surface defining an interior space configured to receive a melt therein so that the melt has a melt surface at a starting zone of the inner wall surface extending around the melt surface;
    the inner wall surface in the starting zone comprising a roughened portion that is roughened by multiple depressions therein, the multiple depressions being spaced from one another at a maximum distance of 5 mm, so that said inner wall surface is configured to provide the roughened portion, facing the melt surface, so that the roughened portion stabilizes the melt surface during a process pulling material therefrom, wherein said roughened portion in the starting zone is located in an upper third of the crucible.

11. The quartz glass crucible according to claim 10, wherein outside of the roughened portion, the inner wall surface is smoother than in the roughened portion.

12. The quartz glass crucible according to claim 11, wherein the inner wall surface outside the roughened portion thereof is smoothed by fire polishing.

13. The quartz glass crucible according to claim 10, wherein the roughened portion extends circumferentially completely around the melt surface.

14. The quartz glass crucible according to claim 10, wherein the depressions are separated by a maximum distance of 1 mm.

15. The quartz glass crucible according to claim 10, wherein the depressions are separated by a maximum distance of 100 μm.

16. The quartz glass crucible according to claim 10, wherein the inner wall surface is formed of synthetic quartz glass.

17. The quartz glass crucible according to claim 10, wherein said roughened portion of the inner wall surface has an etched structure.

18. The quartz glass crucible according to claim 10, wherein said roughened portion of the inner wall surface has a repeating impression pattern.

19. The quartz glass crucible according to claim 10, wherein said roughened portion of the inner wall surface is scored so as to have scores therein.

20. The quartz glass crucible according to claim 10, wherein said roughened portion in the starting zone of the inner wall surface has a bubble zone in which the inner wall surface has open pores therein.

* * * * *